(12) United States Patent
Lai et al.

(10) Patent No.: US 6,736,196 B2
(45) Date of Patent: May 18, 2004

(54) FAN DUCT ASSEMBLY (75) Inventors: Cheng-Tien Lai, Tu-Chen (TW); Tsung-Lung Lee, Tu-Chen (TW); Shuai Jiang, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 130 days.

(21) Appl. No.: 10/116,308

(22) Filed: Apr. 3, 2002

(65) Prior Publication Data

US 2003/0188847 A1 Oct. 9, 2003

(30) Foreign Application Priority Data

Jan. 30, 2002 (TW) .......................................... 91200995

(51) Int. Cl.[7] .................................................. H05K 7/20
(52) U.S. Cl. ...................... 165/122; 165/80.3; 361/697; 415/178; 454/184
(58) Field of Search ................................ 165/80.3, 121, 165/137, 185; 174/16.3; 257/722; 361/691, 695, 697, 694, 704; 454/184; 415/178

(56) References Cited

U.S. PATENT DOCUMENTS

| | | | | |
|---|---|---|---|---|
| 5,563,768 A | * | 10/1996 | Perdue | 361/695 |
| 5,630,469 A | * | 5/1997 | Butterbaugh et al. | 165/80.3 |
| 5,917,698 A | * | 6/1999 | Viallet | 361/695 |
| 6,094,346 A | * | 7/2000 | Schweers et al. | 361/695 |
| 6,343,011 B1 | * | 1/2002 | Yu | 361/695 |
| 6,464,578 B1 | * | 10/2002 | Chin et al. | 454/184 |
| 6,496,368 B2 | * | 12/2002 | Jui-Yuan | 361/697 |
| 6,515,862 B1 | * | 2/2003 | Wong et al. | 361/710 |
| 6,587,335 B1 | * | 7/2003 | Nelson et al. | 361/687 |

* cited by examiner

*Primary Examiner*—Leonard R. Leo
(74) *Attorney, Agent, or Firm*—Wei Te Chung (57) ABSTRACT

A fan duct assembly includes a base (1), a first plate (20), a second plate (30) pivotably connected to the first plate, a connection member (40) pivotably connected to the second plate, and a fan cover (70) connected with the connection member. The base is mounted over a heat sink, and includes a pair of side panels (3). Each side panel has a horizontal portion (7), a slant portion (9) and a vertical portion (11). The horizontal portions, slant portions and vertical portions define a pair of locking apertures (13), respectively. The connection member has a pair of latches (52). The latches can be selectively engaged in any one pair of the locking apertures and orientations of the plates can be varied. Accordingly, outside cooling air from the fan cover can be guided through the connection member to the heat sink from a variety of directions.

23 Claims, 7 Drawing Sheets

FAN DUCT ASSEMBLY

BACKGROUND OF THE INVENTION

1. Field of the Invention

The present invention relates to fan duct assemblies for electronic devices, and particularly to fan duct assemblies which have adjustable configurations.

2. Related Art

Electronic devices such as central processing units (CPUs) frequently generate large amounts of heat during normal operation, which can destabilize operation and cause damage. Oftentimes, a heat dissipation assembly is used to dissipate heat from the electronic device. The heat dissipation assembly frequently comprises a fan facilitating removal of heat from the electronic device.

Conventionally, a heat sink is mounted on a CPU inside a computer. The fan is directly mounted on the heat sink. The fan generates currents of air flowing through the heat sink, causing heat to be dissipated into the surrounding air. However, most of such air remains inside the computer.

Thus fan duct assembles have been developed to draw outside cooling air to flow through heat dissipation assemblies to dissipate heat from CPUs. A conventional fan duct assembly is disclosed in U.S. Pat. No. 5,917,697. The fan duct assembly comprises a fan above a heat sink secured on a CPU, and an air pipe. One end of the air pipe is connected to an air inlet of the fan. An opposite end of the air pipe is secured to a frame board at a rear side of a computer, and is in communication with an outside of the computer. The fan draws outside cooling air to the heat sink through the air pipe. However, this kind of fan duct assembly can only fit a heat sink having a particular configuration, and is usable only when the CPU is located in a particular position. When the configuration of the heat sink or the position of the CPU is changed, the fan duct assembly can no longer be used.

SUMMARY OF THE INVENTION

Accordingly, an object of the present invention is to provide a fan duct assembly which has an adjustable configuration that can fit a variety of heat dissipating devices used in a variety of locations in a computer.

To achieve the above-mentioned object, a fan duct assembly in accordance with the present invention comprises a base, first and second plates, a connection member, and a fan cover. The base comprises a pair of side panels and a top panel cooperatively forming a space for receiving a heat sink that is attached on an electronic device. The side panels sequentially comprise a pair of horizontal portions, a pair of slant portions, and a pair of vertical portions. The horizontal portions, slant portions and vertical portions define a pair of locking apertures, respectively. The second plate is pivotably connected to the first plate. The connection member is pivotably connected to the second plate. The combined first plate, second plate and connection member is movable along the horizontal portions, the slant portions and the vertical portions. The connection member comprises a pair of latches. The fan cover is mounted to the connection member and adapted for connecting with an air pipe. The latches of the connection member can be selectively engaged in any one pair of the locking apertures and orientations of the plates can thus be varied. Accordingly, outside cooling air from the fan cover can be guided through the connection member to the heat sink from a variety of directions.

Other objects, advantages and novel features of the present invention will be drawn from the following detailed description of preferred embodiment of the present invention with attached drawings, in which:

DESCRIPTION OF THE PREFERRED EMBODIMENT

Figure 1:
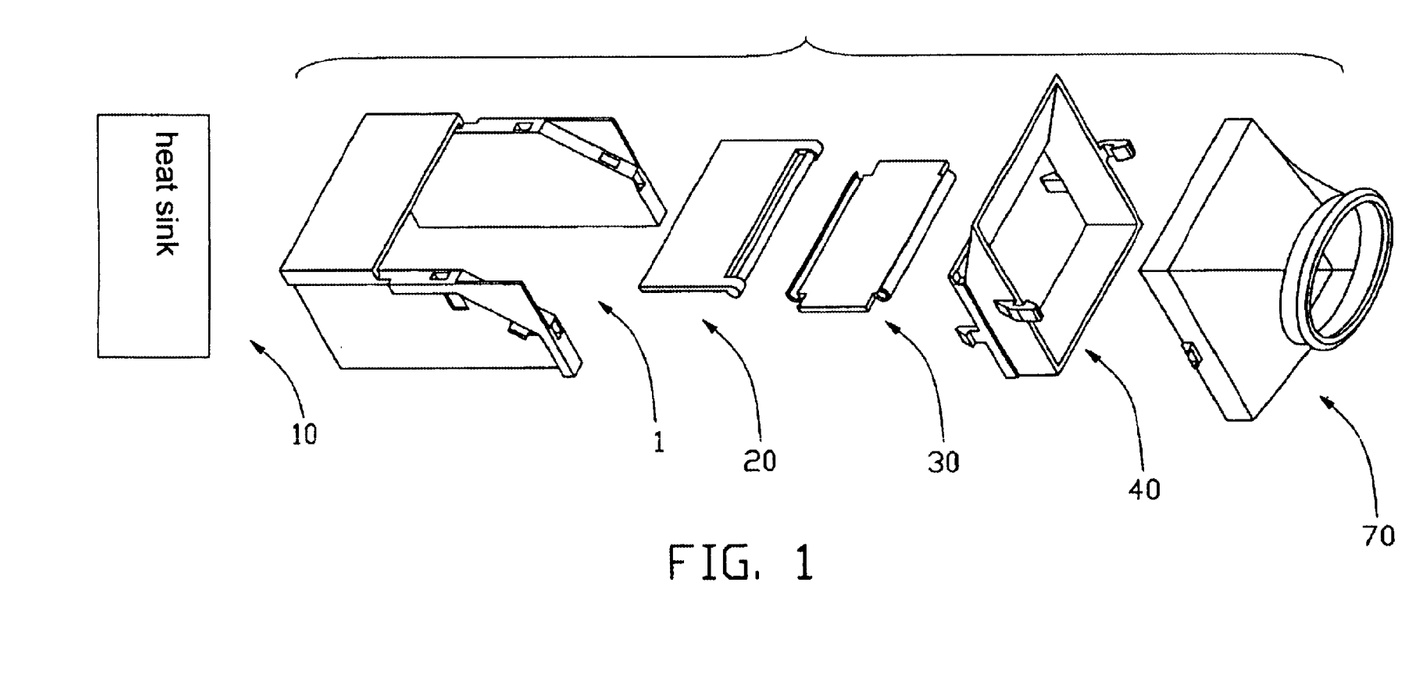
FIG. 1 is an exploded perspective view of a fan duct assembly and heat sink in accordance with the present invention.

Referring to the attached drawings, FIG. 1 shows a fan duct assembly and heat sink in accordance with the present invention. The fan duct assembly comprises a base 1, a rectangular first plate 20, a rectangular second plate 30, a connection member 40, and a fan cover 70. The heat sink 10 is located under the fan duct assembly.

Figure 2:
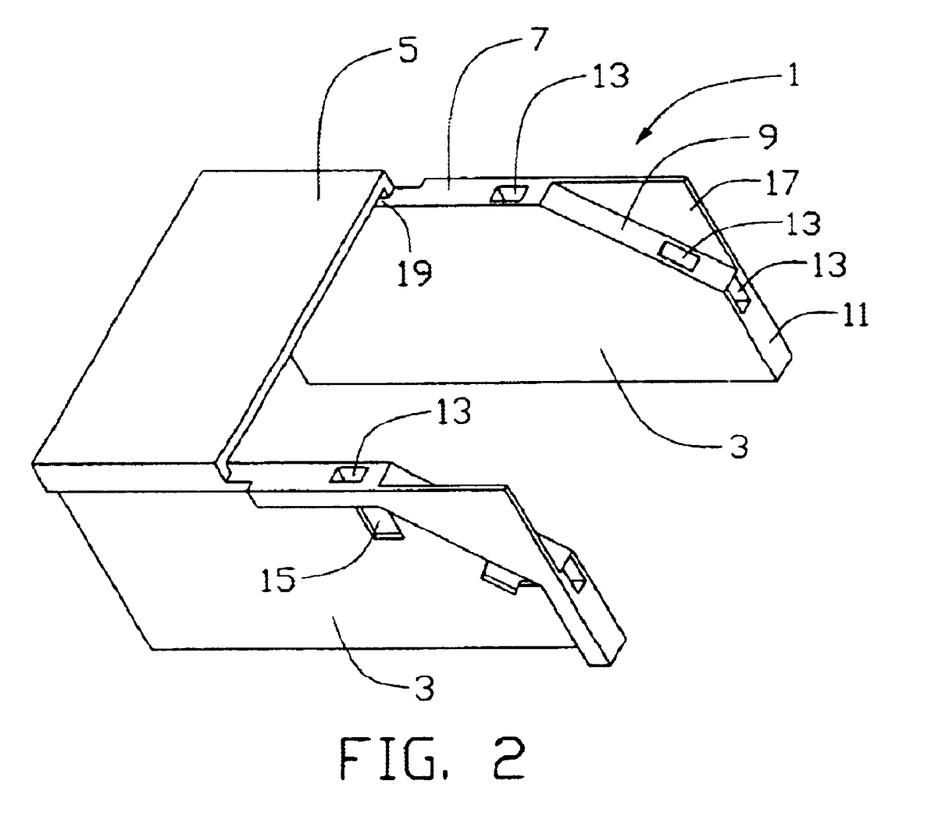
FIG. 2 is an enlarged perspective view of a base of the fan duct assembly of FIG. 1.

Referring to FIG. 2, the base 1 is for being mounted over heat sink 10 which in turn is mounted on a central processing unit (CPU) (not shown). The base 1 comprises a pair of opposite side panels 3, and a top panel 5 integrally connected between end sections of the side panels 3. The side panels 3 cooperate with the top panel 5 to define an inner space therebetween for receiving the CPU. Each side panel 3 sequentially comprises a horizontal portion 7, a slant portion 9, and a vertical portion 11. The horizontal portion 7 is formed along a middle section of a top of the side panel 3, adjacent the top panel 5. The slant portion 9 extends from an edge of the horizontal portion 7 that is distal from the top panel 5 to the vertical portion 1. The horizontal portions 7, the slant portions 9 and the vertical portions 11 respectively define upper, upper/side and side openings to communicate the inner space to an exterior, wherein each define a locking aperture 13 therein. Three locking slots 15 are defined in an outside face of the side panel 3. Each locking slot 15 is disposed inwardly from and in communication with a corresponding locking aperture 13. A baffle 17 extends generally upwardly from an external longitudinal edge of the slant portion 9. A pair of guiding slots 19 is respectively defined between the end sections of the side panels 3 and the top panel 5. The guiding slots 19 oppose each other at opposite sides of the top panel 5.

Figure 3:
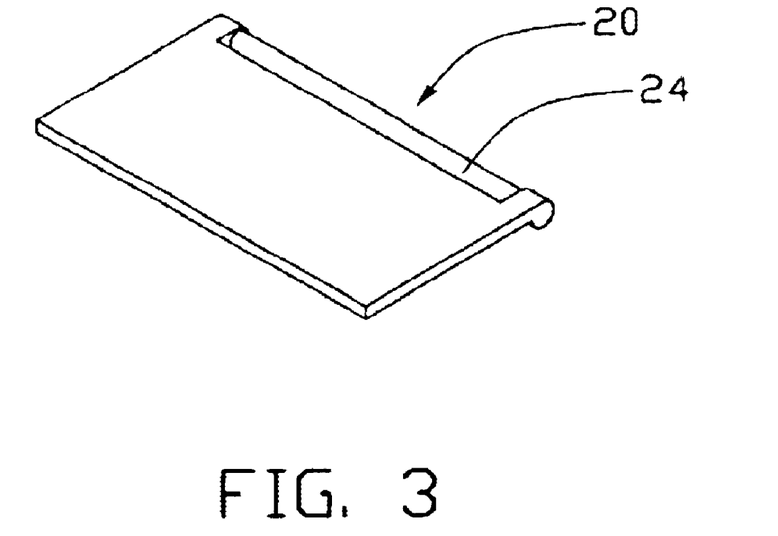
FIG. 3 is an enlarged perspective view of a first plate of the fan duct assembly of FIG. 1, viewed from another aspect.
Figure 4:
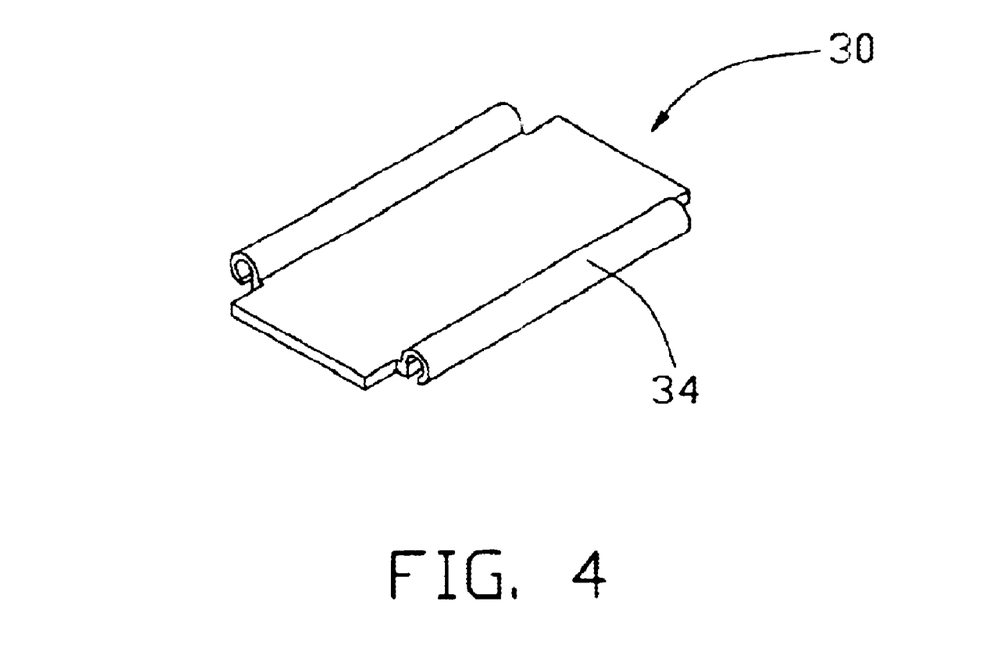
FIG. 4 is an enlarged perspective view of a second plate of the fan duct assembly of FIG. 1, viewed from another aspect.

Referring to FIGS. 3 and 4, the first plate 20 comprises a cylindrical first pivot 24 formed along one longitudinal edge thereof. The second plate 30 comprises a pair of hinges 34 respectively formed along opposite longitudinal edges thereof. Each hinge 34 has a generally C-shaped profile.

Figure 5:
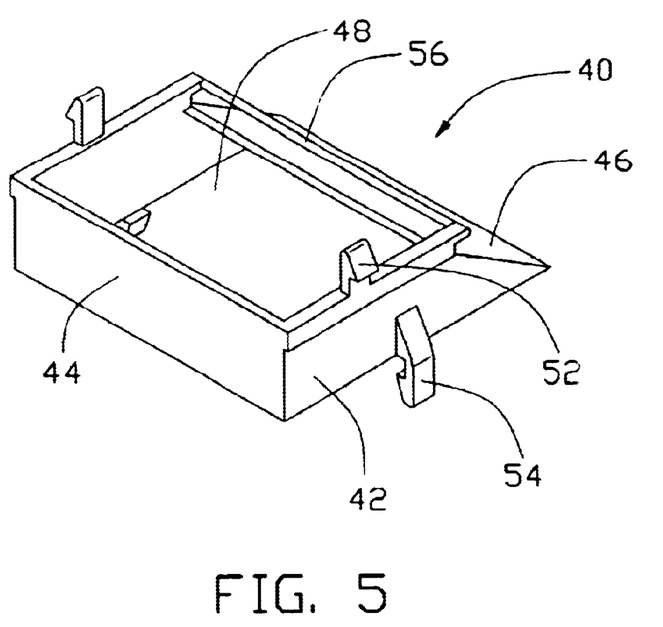
FIG. 5 is an enlarged perspective view of a connection member of the fan duct assembly of FIG. 1, viewed from another aspect.

Referring to FIG. 5, the connection member 40 comprises a pair of symmetrically opposing side walls 42, a first connect wall 44 and a slanted second connect wall 46. Each side wall 42 has a shorter longitudinal edge, an opposite longer longitudinal edge, a first end that is perpendicular to the shorter and longer longitudinal edges, and an opposite second end that is oblique to the shorter and longer longitudinal edges. The first connect wall 44 is integrally connected between the first ends of the side walls 42. The second connect wall 46 is integrally connected between the second ends of the side walls 42. The side walls 42 and first and second connect walls 44, 46 cooperatively define an opening 48 therebetween. A pair of latches 52 respectively extends in a first direction from middle sections of the shorter longitudinal edges of the side walls 42, for engaging in the corresponding locking apertures 13 of the vertical portions 11 of the base 1. A pair of catches 54 is respectively formed on middle sections of outer faces of the side walls 42 adjacent the longer longitudinal edges. The catches 54 respectively extend from the side walls 42 in a second direction that is opposite to the first direction, for engaging with the fan cover 70. A cylindrical second pivot 56 is formed between the second ends of the side walls 42 at the shorter longitudinal edges, adjacent the second connect wall 46.

Figure 6:
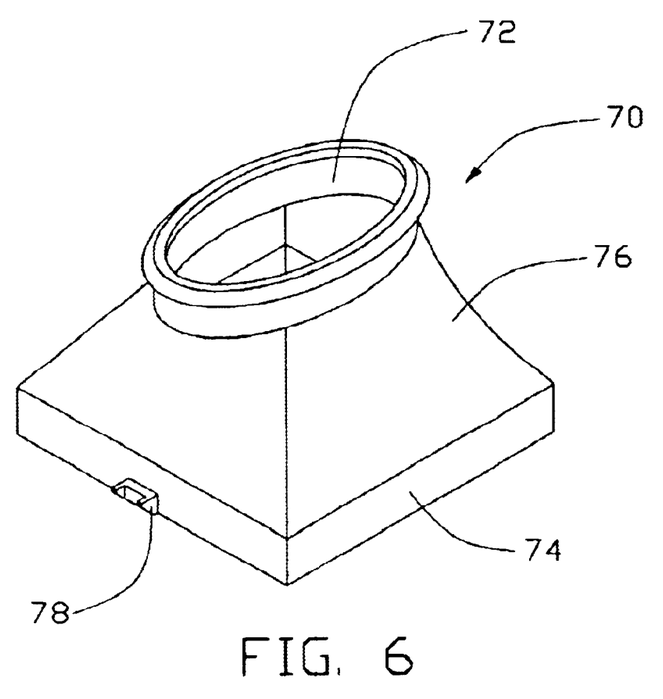
FIG. 6 is an enlarged perspective view of a fan cover of the fan duct assembly of FIG. 1, viewed from another aspect.

Referring to FIG. 6, the fan cover 70 comprises a rectangular frame 74 having a fan (not shown) mounted therein, a shell 76 integrally connected with the frame 74, and a generally circular air inlet 72 defined in an end of the shell 76 that is opposite to the frame 74. The shell 76 tapers from the frame 74 to the air inlet 72. The shell 76 at the air inlet 72 is adapted to connect with an air pipe, for intake of outside cooling air to the fan duct assembly. A pair of clasps 78 is formed on opposite sides of the frame 74, corresponding to the catches 52 of the connection member 40.

Figure 7:
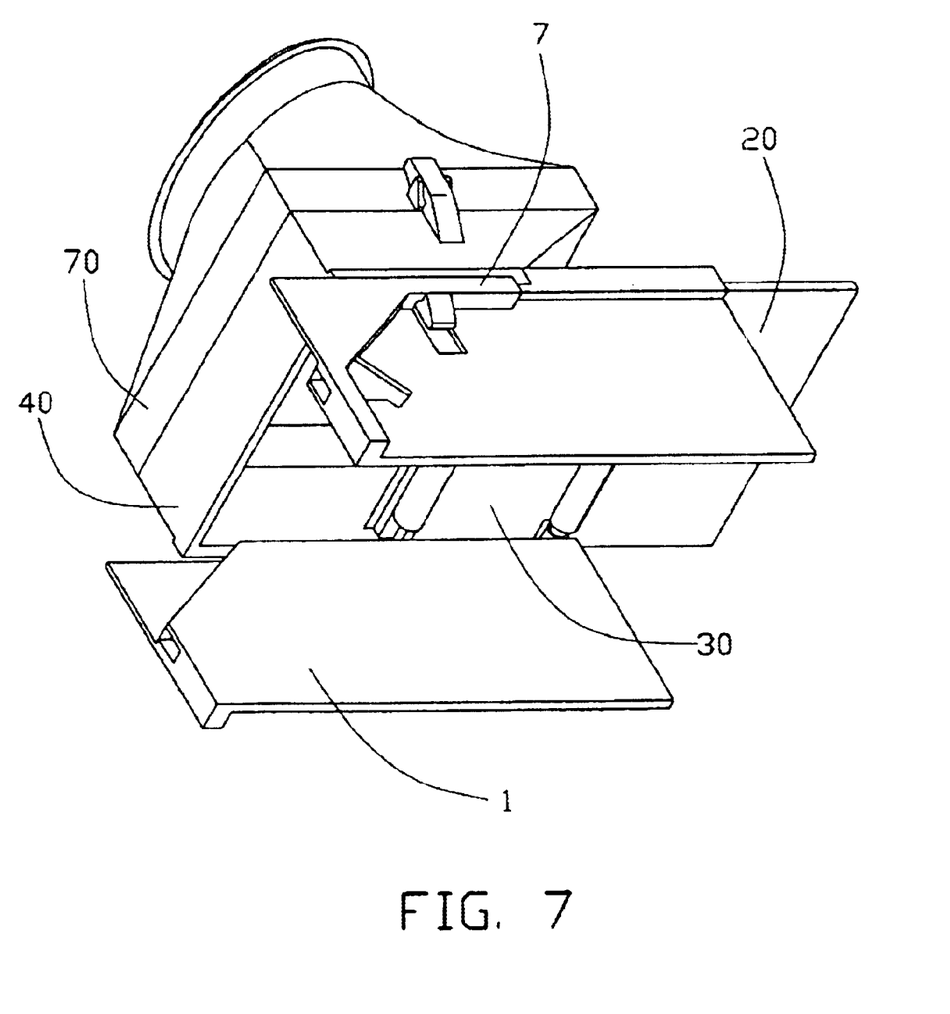
FIG. 7 is an assembled view of FIG. 1, viewed from another aspect, and showing the connection member located in a first position.
Figure 8:
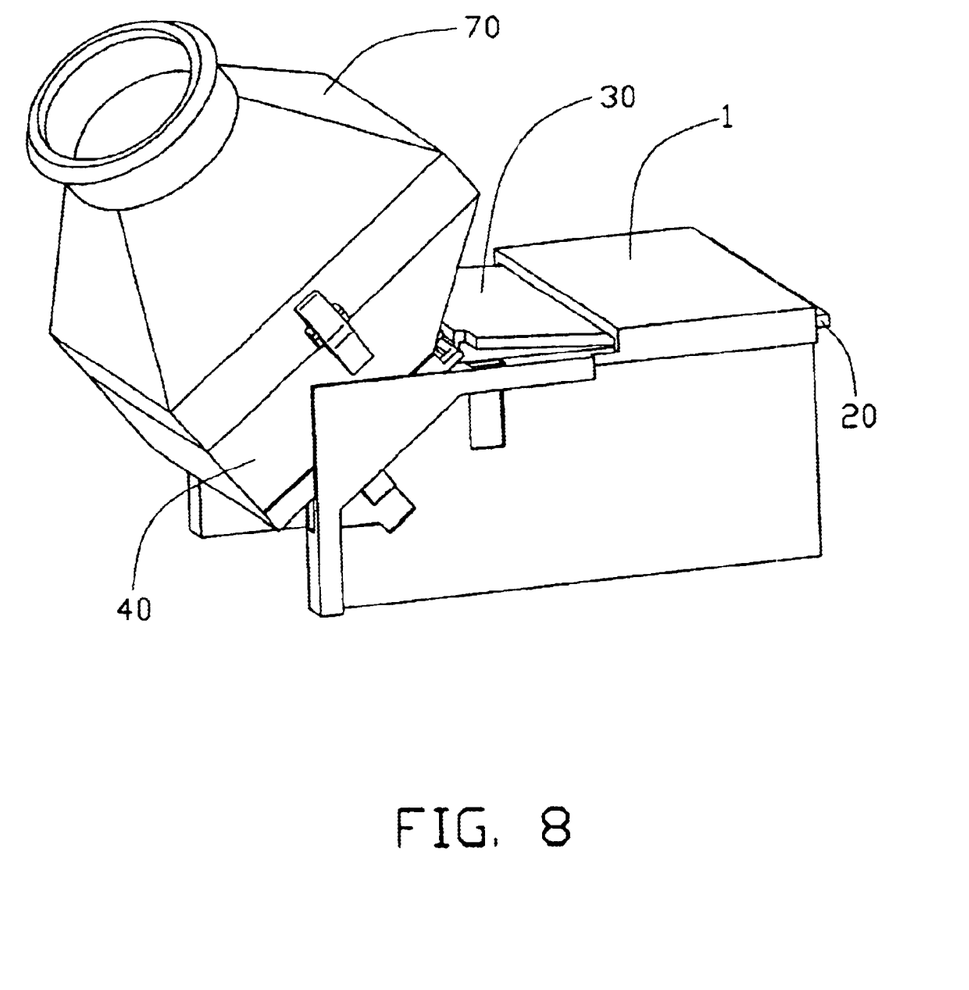
FIG. 8 is an assembled view of FIG. 1, viewed from another aspect, and showing the connection member located in a second position.
Figure 9:
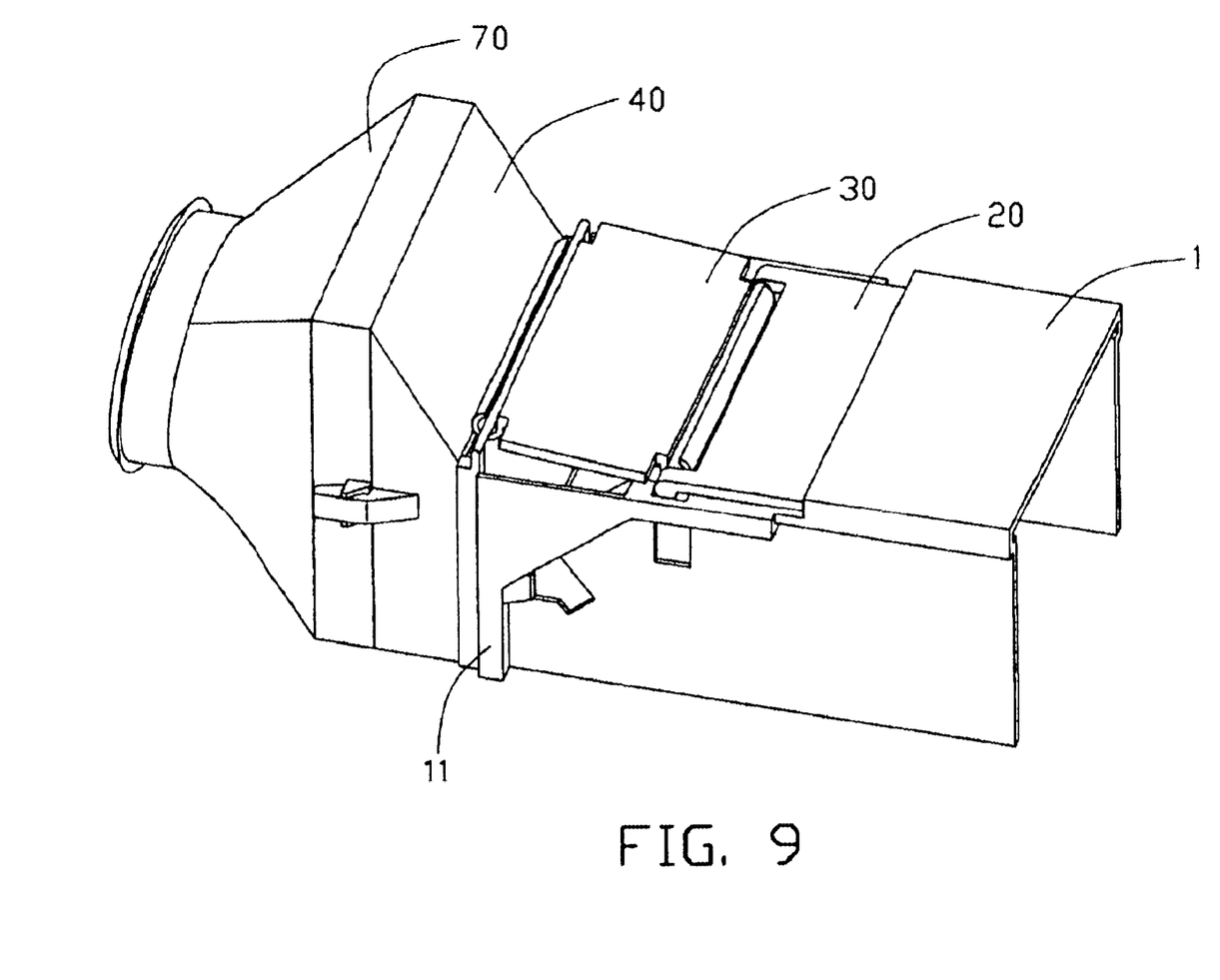
FIG. 9 is an assembled view of FIG. 1, viewed from another aspect, and showing the connection member located in a third position.

Referring also to FIGS. 7–9, in assembly, the first pivot 24 of the first plate 20 is pivotably received in one of the hinges 34 of the second plate 30. The second plate 30 is thus pivotably connected to the first plate 20. The combined first and second plates 20, 30 is attached to the base 1. The first plate 20 is received in the guiding slots 19, and slid below the top panel 5. The second pivot 56 of the connection member 40 is then pivotably received in the other hinge 34 of the second plate 30. The connection member 40 is thus pivotably connected to the second plate 30. The first plate 20, second plate 30, and connection member 40 are thus combined into a single unit which is slidable along the horizontal portions 7, the slant portions 9 and the vertical portions 11. The connection member 40 is attached to the base 1. The latches 54 are inserted into a desired pair of locking apertures 13, and snappingly received in the corresponding pair of locking slots 15. The connection member 40 is thereby prevented from moving in directions perpendicular to the latches 54. The fan cover 70 is then attached to the connection member 40, with the catches 54 of the connection member 40 snappingly engaging with the clasps 78 of the fan cover 70. The fan duct assembly is thus fully assembled.

In the present invention, when the latches 52 are engaged in the locking apertures 13 of the horizontal portions 7 of the base 1, the first plate 20 protrudes out from the top panel 5 and the second plate 30 is located below the top panel 5 (see FIG. 7). The fan duct assembly draws outside cooling air to the heat sink (not shown) from a position directly above the heat sink. When the latches 52 are engaged in the locking apertures 13 of the slant portions 9 of the base 1, the first plate 20 is located below the top panel 5 and the second plate 30 covers the horizontal portions 7 (see FIG. 8). The fan duct assembly draws outside cooling air to the heat sink from a position above and at a side of the heat sink. When the latches 52 engage in the locking apertures 13 of the vertical portions 11 of the base 1, the first plate 20 covers the horizontal portions 7 and the second plate 30 covers the slant portions 9 (see FIG. 9). The fan duct assembly draws outside cooling air to the heat sink from a position at a side of the heat sink. The baffles 17 cooperate with the first and second plates 20, 30 to guide outside cooling air to the heat sink.

It is understood that the invention may be embodied in other forms without departing from the spirit thereof. Thus, the present example and embodiment is to be considered in all respects as illustrative and not restrictive, and the invention is not to be limited to the details given herein. For example, the connection member and the fan cover may be made of one piece.

What is claimed is:

1. A fan duct assembly comprising:
   a base adapted for being mounted over a heat sink, the base defining a plurality of pairs of locking apertures;
   a connection member having a pair of latches;
   a fan cover mounted to the connection member and adapted for connecting with an air pipe; and
   at least one plate pivotably connected to the connection member and slidably attached to the base, wherein
   the latches can be selectively engaged in any one pair of the pairs of locking apertures, and a position of the at least one plate is able to be varied accordingly, thereby allowing outside cooling air from the fan cover to be guided through the connection member to the heat sink from a variety of directions.

2. The fan duct assembly as claimed in claim 1, wherein the base comprises a pair of side panels and a top panel connected between ends of the side panels, each of the side panels sequentially comprises a horizontal portion adjacent the top panel, a slant portion and a vertical portion, each of the horizontal, slant and vertical portions defines one locking aperture, a pair of guiding slots is defined in the side panels below the top panel, and the at least one plate is movable along the guiding slots.

3. The fan duct assembly as claimed in claim 2, wherein the at least one plate comprises a first plate and a second plate, one side of the second plate is pivotably connected to the first plate, the connection member is pivotably connected to an opposite side of the second plate, and the combined first plate, second plate and connection member is slidable along the guiding slot, the horizontal portions, the slant portions and the vertical portions.

4. The fan duct assembly as claimed in claim 3, wherein the second plate comprises a pair of hinges on opposite sides thereof, the first plate has a first pivot received in one of the hinges, and the connection member has a second pivot received in the other of the hinges.

5. The fan duct assembly as claimed in claim 3, wherein when the latches are engaged in the locking apertures of the horizontal portions of the base, the first plate protrudes out from the top panel and the second plate is located below the top panel.

6. The fan duct assembly as claimed in claim 3, wherein when the latches are engaged in the locking apertures of the slant portions of the base, the first plate is located below the top panel and the second plate covers the horizontal portions.

7. The fan duct assembly as claimed in claim 3, wherein when the latches are engaged in the locking apertures of the vertical portions of the base, the first plate covers the horizontal portions and the second plate covers the slant portions.

8. The fan duct assembly as claimed in claim 7, wherein a pair of baffles extends generally upwardly from external edges of the slant portions, for facilitating guiding of outside cooling air to the heat sink.

9. The fan duct assembly as claimed in claim 1, wherein the fan cover comprises a pair of clasps, and the connection member comprises a pair of catches engaging with the clasps.

10. The fan duct assembly as claimed in claim 1, wherein the base further defines a plurality of pairs of locking slots, each of the pairs of locking slots is respectively in communication with each of the pairs of locking apertures, and when the latches are selectively engaged in any one pair of the pairs of locking apertures, the latches are also received in a corresponding pair of locking slots, whereby the connection member is prevented from moving in directions perpendicular to the latches.

11. A heat dissipating assembly comprising:
a heat sink adapted for being mounted on an electronic device to dissipate heat therefrom; and
a fan duct assembly comprising:
a base mounted to the heat sink, the base comprising a top panel and a pair of side panels cooperatively defining a space therebetween receiving the heat sink, each of the side panels comprising a horizontal portion, a slant portion and a vertical portion;
a connection member defining an opening therein; and
a fan cover mounted to the connection member, the fan cover having a fan adapted for drawing outside cooling air to the fan duct assembly, wherein the connection member can be selectively mounted to the horizontal portions, the slant portions, or the vertical portions thereby allowing the fan duct assembly to draw outside cooling air to the heat sink from a variety of directions.

12. The heat dissipating assembly as claimed in claim 11, wherein the fan duct assembly further comprises at least one plate slidably attached to the base for facilitating the drawing of outside cooling air to the heat sink.

13. The heat dissipating assembly as claimed in claim 12, wherein the at least one plate comprises a first plate and a second plate, one side of the second plate is pivotably connected to the first plate, the connection member is pivotably connected to an opposite side of the second plate, and the combined first plate, second plate and connection member is slidable along the horizontal portions, the slant portions and the vertical portions.

14. The heat dissipating assembly as claimed in claim 13, wherein the second plate comprises a pair of hinges on opposite sides thereof, the first plate has a first pivot received in one of the hinges, and the connection member has a second pivot received in the other of the hinges.

15. The heat dissipating assembly as claimed in claim 13, wherein when the connection member is mounted on the horizontal portions of the base, the first plate protrudes out from the top panel and the second plate is located below the top panel.

16. The heat dissipating assembly as claimed in claim 13, wherein when the connection member is mounted on the slant portions of the base, the first plate is located below the top panel and the second plate covers the horizontal portions.

17. The heat dissipating assembly as claimed in claim 13, wherein when the connection member is mounted on the vertical portions of the base, the first plate covers the horizontal portions and the second plate covers the slant portions.

18. The heat dissipating assembly as claimed in claim 17, wherein the base comprises a pair of baffles extending generally upwardly from external edges of the slant portions, for facilitating guiding of the outside cooling air to the heat sink.

19. The heat dissipating assembly as claimed in claim 11, wherein the horizontal portions, the slant portions, and the vertical portions each define a locking aperture, and the connection member comprises a pair of latches that can be selectively engaged in a corresponding pair of locking apertures.

20. The heat dissipating assembly as claimed in claim 11, wherein the fan cover comprises a pair of clasps, and the connection member comprises a pair of catches engaging with the clasps.

21. A fan duct assembly comprising:
a base defining therein a space for cooling a heat sink therein, and upper and side openings for inletting air flow;
a fan cover with a connection member moveably and latchably selectively positioned on the base to at least partially cover said upper or side openings; and
at least one plate flexibly linked to said connection member and moveable associatively with said fan and said connection member; wherein
said at least one plate is able to cover at least partially one of said upper and side openings when said fan cover with said connection member covers at least partially the other of said upper and side openings, so as to cooperatively guide the air flow.

22. The assembly as claimed in claim 21, wherein said one of said upper and side openings is the upper opening, and said other is the side opening.

23. The assembly as claimed in claim 21, wherein said plate is pivotally attached to said connection member.

* * * * *